United States Patent
Lee et al.

(10) Patent No.: US 8,418,361 B2
(45) Date of Patent: Apr. 16, 2013

(54) METHOD OF MANUFACTURING PRINTED CIRCUIT BOARD HAVING LANDLESS VIA HOLE

(75) Inventors: Suk Won Lee, Gyunggi-do (KR); Chang Gun Oh, Gyunggi-do (KR); Mi Sun Hwang, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 13/299,685

(22) Filed: Nov. 18, 2011

(65) Prior Publication Data

US 2012/0060369 A1 Mar. 15, 2012

Related U.S. Application Data

(62) Division of application No. 12/213,975, filed on Jun. 26, 2008, now abandoned.

(30) Foreign Application Priority Data

Apr. 15, 2008 (KR) .......................... 10-2008-0034874

(51) Int. Cl.
*H05K 3/02* (2006.01)

(52) U.S. Cl.
USPC ................. 29/847; 29/830; 29/831; 29/846; 29/852

(58) Field of Classification Search .................. 29/847, 29/830, 831, 846, 852, 853; 174/257–259, 174/262, 264, 266; 427/97.2, 98.1, 99.5, 427/443.1
See application file for complete search history.

(56) References Cited

U.S. PATENT DOCUMENTS

| 5,817,405 A | 10/1998 | Bhatt et al. |
| 6,490,170 B2 * | 12/2002 | Asai et al. ..................... 361/794 |
| 7,858,885 B2 | 12/2010 | Hsu |
| 8,276,270 B2 * | 10/2012 | Hotta et al. ..................... 29/852 |
| 2005/0139391 A1 | 6/2005 | Li et al. |

FOREIGN PATENT DOCUMENTS

| JP | 2005-167154 | 6/2005 |
| KR | 100688702 | 2/2007 |

OTHER PUBLICATIONS

Korean Office Action issued Feb. 3, 2010 in corresponding Korean Patent Application No. 10-2008-0049277.
U.S. Patent Restriction Requirement mailed Apr. 18, 2011 in corresponding U.S. Appl. No. 12/213,975.
U.S. Patent Office Action mailed Jun. 8, 2011 in corresponding U.S. Appl. No. 12/213,975.

* cited by examiner

*Primary Examiner* — Thiem Phan

(57) ABSTRACT

Method of manufacturing printed circuit board, including: providing a substrate including a first circuit layer having a lower land of a via; forming an insulating layer on the first circuit layer; forming a via hole in the insulating layer; filling the via hole with a first metal, thus forming a via; forming a seed layer with a second metal on the insulating layer and an exposed surface of the via; applying a resist film on the seed layer, and forming a resist pattern having an opening for a second circuit layer with a width formed on the via being smaller than a width of the via; plating a circuit region defined by the opening with a third metal, thus forming a plating layer formed of the third metal; and removing the resist film, and selectively removing an exposed portion of the seed layer, thus forming a second circuit layer.

5 Claims, 9 Drawing Sheets

METHOD OF MANUFACTURING PRINTED CIRCUIT BOARD HAVING LANDLESS VIA HOLE

CROSS-REFERENCE TO RELATED APPLICATIONS

This application is a U.S. divisional application filed under 37 CFR 1.53(b) claiming priority benefit of U.S. Ser. No. 12/213,975 filed in the United States on Jun. 26, 2008 now abandoned, which claims earlier priority benefit to Korean Patent Application No. 10-2008-0034874 filed with the Korean Intellectual Property Office on Apr. 5, 2008, the disclosures of which are incorporated herein by reference.

BACKGROUND

1. Field

The present invention relates, in general, to a printed circuit board (PCB) having a landless via hole and a method of manufacturing the same, and, more particularly, to a method of manufacturing a PCB having a landless via hole, in which the via hole has no upper land, by filling a via hole formed in an insulating layer with a conductive metal and then forming a seed layer with a metal that is able to be selectively etched with the metal charged in a via.

2. Description of the Related Art

With the development of electronic industries, the demand for increased functionalization and miniaturization of electronic parts is rapidly increasing. According to this trend, PCBs or circuit patterns are required to be increasingly dense, and thus, various methods of realizing a fine circuit pattern are being devised, proposed, and applied.

Among such methods of realizing a fine circuit pattern, the present invention discloses a method of removing the upper land of a via hole to thus achieve a high-density circuit pattern with a landless via hole.

FIG. 1 is a top plan view illustrating a conventional PCB, in which the upper land of a via is formed. As seen in FIG. 1, because circuit patterns 105a are formed at small widths on a substrate but include the upper lands 104b of via holes 104a around the via holes 104a, fineness is not realized in the corresponding region. For example, in the case where the diameter of the via hole 104a is about 65 μm, the upper land around the via hole is formed at a width of about 165 μm in consideration of process error. In this way, because the upper land is formed, a high-density circuit pattern is difficult to realize on the substrate. Thus, a via arrangement is designed in a zigzag type (FIG. 1) so that land portions do not overlap each other, but limitations are imposed on the ability to realize a high-density circuit pattern, attributable to the wider upper land.

Accordingly, a landless via hole from which the upper land is excluded has been introduced. Korean Patent No. 688702 discloses a method of manufacturing a PCB with a landless via hole, in which a via hole has no upper land, using a photosensitive resist which is loaded in the via hole.

FIG. 2 is a perspective view illustrating the landless via hole disclosed in Korean Patent No. 688702. As illustrated in FIG. 2, the landless via hole is formed such that a circuit pattern 1 is connected to the inner plating layer of a via hole 4 to thus realize a fine circuit pattern having no upper land. However, the case where the circuit pattern is connected to the inner plating layer of the via hole 4 is problematic in that the probability of poor contact is high and the process for manufacturing such a structure is complicated.

Thus, a PCB having a landless via hole and a method of manufacturing the same, in which the upper land of a via is removed in order to form a fine circuit pattern, and further, the connection between the via and the circuit pattern is good, are required.

SUMMARY

Therefore, the present invention has been made keeping in mind the above problems encountered in the related art and provides a PCB having a landless via hole and a method of manufacturing the same, in which the upper land of a via is removed, thus forming a fine circuit pattern, and further, the via can be efficiently connected with the circuit pattern.

According to the present invention, a PCB may comprise a circuit pattern formed on a via formed of a first metal, wherein the line width of the upper portion of the circuit pattern is smaller than the diameter of a via hole, and the circuit pattern may include a seed layer formed of a second metal and a plating layer formed of a third metal, which is different from the second metal.

In the present invention, the second metal may have resistance to chemical etching different from those of the first metal and the third metal so that the second metal is etched and the first metal and the third metal are not etched under the same chemical etching conditions.

In the present invention, the first metal and the third metal may be copper, and the second metal may be any one selected from among gold, silver, zinc, palladium, ruthenium, nickel, rhodium, lead-tin solder alloys, and nickel-gold alloys.

In the present invention, the circuit pattern may be in surface contact with the via across the via.

In the present invention, the circuit pattern may have a rectangular cross-sectional shape in a width direction.

In the present invention, the circuit pattern may have a cross-sectional shape of an inverted "T" in a width direction.

In the present invention, the circuit pattern may comprise a lower circuit pattern in surface contact with the via hole and an upper circuit pattern formed on the lower circuit pattern and having a width smaller than the width of the lower circuit pattern.

In addition, according to the present invention, a method of manufacturing a PCB may comprise (A) providing a substrate including a first circuit layer having the lower land of a via; (B) forming an insulating layer on the first circuit layer; (C) forming a via hole in the insulating layer so that the lower land is exposed; (D) filling the via hole with a first metal, thus forming a via; (E) forming a seed layer with a second metal on the insulating layer and the exposed surface of the via; (F) applying a resist film on the seed layer, and then forming a resist pattern having an opening for a second circuit layer, the width of the opening formed on the via being smaller than the width of the via; (G) plating a circuit region defined by the opening with a third metal, thus forming a plating layer formed of the third metal; and (H) removing the resist film, and then selectively removing the exposed portion of the seed layer, thus forming a second circuit layer.

In the present invention, the second metal may have resistance to chemical etching different from those of the first metal and the third metal, so that the second metal is etched and the first metal and the third metal are not etched under the same chemical etching conditions.

In the present invention, the first metal and the third metal may be copper, and the second metal may be any one selected from among gold, silver, zinc, palladium, ruthenium, nickel, rhodium, lead-tin solder alloys, and nickel-gold alloys.

In the present invention, (D) may comprise (D-1) fill-plating the first metal on the insulating layer including the via hole, thus forming a plating layer formed of the first metal; and (D-2) etching a portion of the plating layer formed of the first metal in a thickness direction while adjusting an etching amount, so that the upper surface of the insulating layer is exposed.

BRIEF DESCRIPTION OF THE DRAWINGS

The features and advantages of the present invention will be more clearly understood from the following detailed description taken in conjunction with the accompanying drawings, in which.

DESCRIPTION OF EMBODIMENTS

Figure 1:
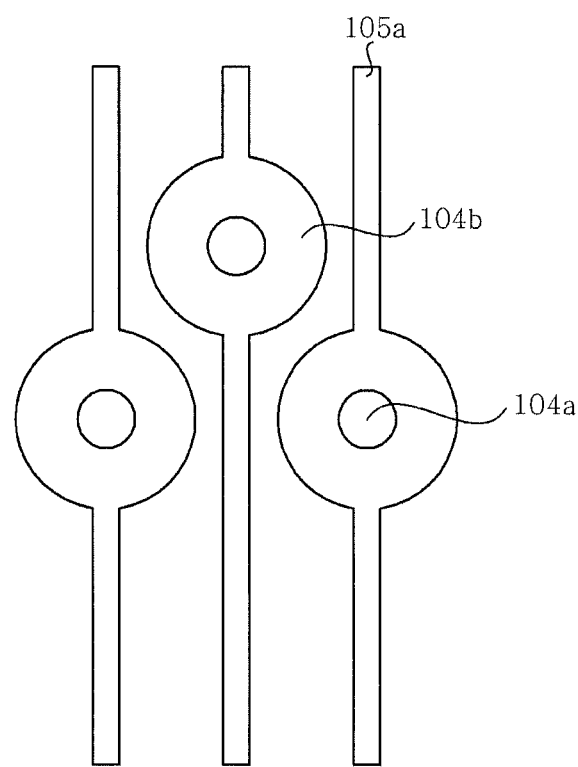
FIG. 1 is a top plan view illustrating a conventional PCB with a circuit layer including an upper land which is connected to a via.
Figure 2:
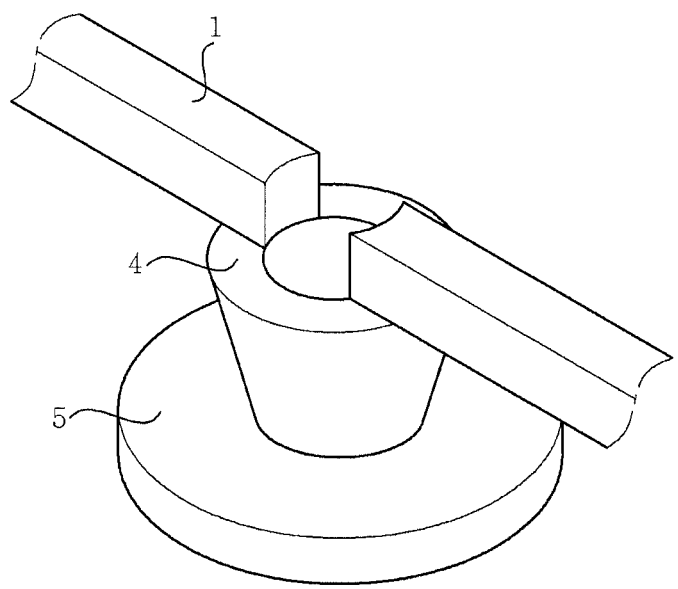
FIG. 2 is a perspective view illustrating a conventional landless via hole.

Hereinafter, a detailed description will be given of a PCB having a landless via hole and a method of manufacturing the same according to the present invention, with reference to the appended drawings. Throughout the drawings, like reference numerals refer to like elements, and redundant descriptions are omitted. In the description, the terms "first", "second" and so on are used to distinguish one element from another element, but are not to be construed to limit the elements. Further, the terms and words used in the present specification and claims should not be interpreted as being limited to typical meanings or dictionary definitions, but should be interpreted as having meanings and concepts relevant to the technical scope of the present invention based on the rule in which an inventor can appropriately define the concept of the term to describe the best method he or she knows for carrying out the invention.

Figure 3A:
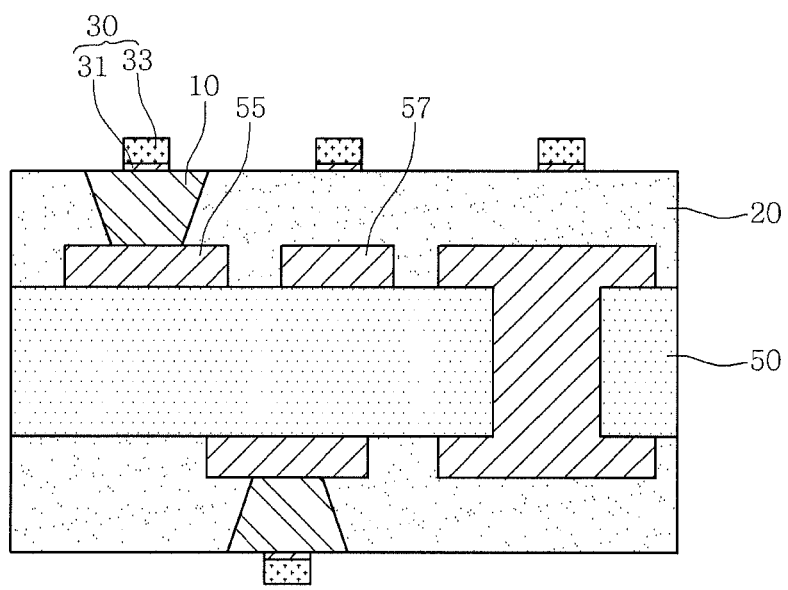
FIGS. 3A to 3C are views illustrating the PCB having a landless via hole according to preferred embodiments of the present invention.
Figure 3B:
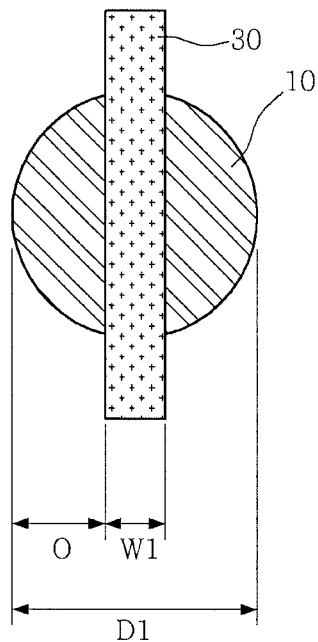

FIG. 3A is a cross-sectional view illustrating the PCB having a landless via hole according to a preferred embodiment of the present invention, and FIG. 3B is a top plan view illustrating the via region of the PCB. As illustrated in FIGS. 3A and 3B, a circuit pattern 30 according to the present invention is formed on the via 10, and has a line width smaller than the diameter of a via hole.

The via 10 is responsible for electrical connection between a lower land 55 and the circuit pattern 30, and is formed of a first metal. In the present invention, the first metal is copper.

The circuit pattern 30, which is a conductive line in surface contact with the upper surface of the via 10, comprises a seed layer 31 of a second metal and a plating layer 33 of a third metal, which have the same width as each other. The seed layer 31 of the second metal has a predetermined width, and the width of the plating layer 33 of the third metal is the same as that of the seed layer. Thus, the circuit pattern 30 has a rectangular shape, and the line width of the circuit pattern 30 is smaller than the diameter of the via 10 connected therewith.

In this way, because the via 10 has no land, a circuit layer can be finely formed on the via 10.

As seen in FIG. 3B, the circuit pattern 30 is formed such that it is brought into surface contact with the upper surface of the via 10 across the via 10, thus realizing a better electrical connection than a conventional circuit pattern connected to the inner plating layer of a via 10.

Here, the resistance of the second metal to chemical etching is different from those of the first metal and the third metal. This means that the second metal may be etched and the first metal and the third metal may not be etched under the same chemical etching conditions. For example, in the case where the first metal and the third metal are copper, the second metal may be any one selected from among gold, silver, zinc, palladium, ruthenium, nickel, rhodium, lead-tin solder alloys, and nickel-gold alloys. This is specifically described below. In the present invention, the second metal is nickel, and the third metal is copper.

Figure 3C:
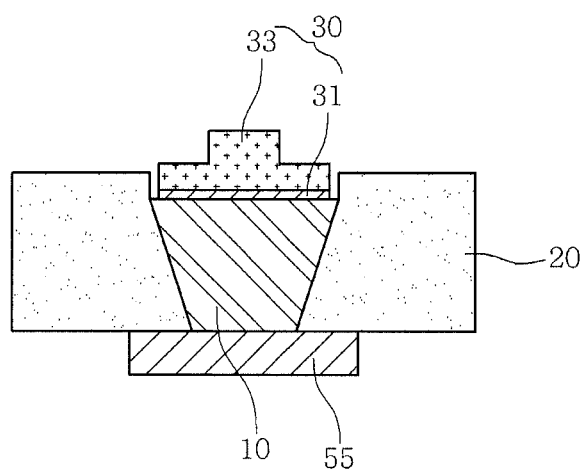

FIG. 3C is a cross-sectional view illustrating the landless via hole according to another preferred embodiment of the present invention. As illustrated in this drawing, the circuit pattern 30 has a cross-sectional shape of an inverted "T". For convenience of description, a circuit pattern 30 located under the upper surface of the insulating layer 20 is referred to as a "lower circuit pattern", and a portion of the circuit pattern 30 protruding from the upper surface of the insulating layer 20 is referred to as an "upper circuit pattern". In the present embodiment, the line width of the upper circuit pattern, protruding from the upper surface of the insulating layer, is smaller than the diameter of the via 10, thus making it possible to realize a high-density circuit pattern.

Below, the method of manufacturing the PCB having a landless via hole according to the preferred embodiment of the present invention is described. FIGS. 4A to 4J sequentially illustrate the process of manufacturing the PCB having a landless via hole according to the present invention.

Figure 4A:
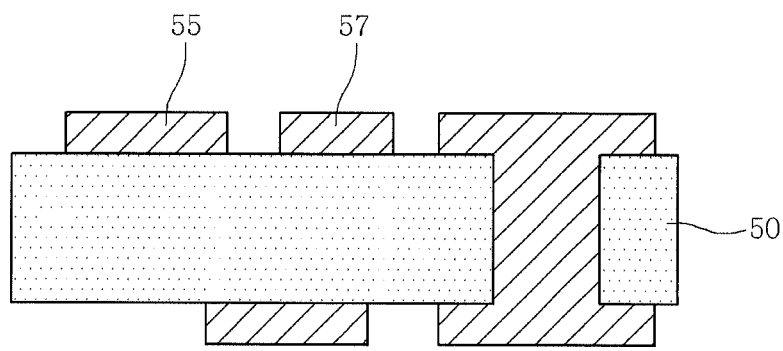
FIGS. 4A to 4J are cross-sectional views sequentially illustrating the process of manufacturing the PCB having a landless via hole according to a preferred embodiment of the present invention.
Figure 4B:
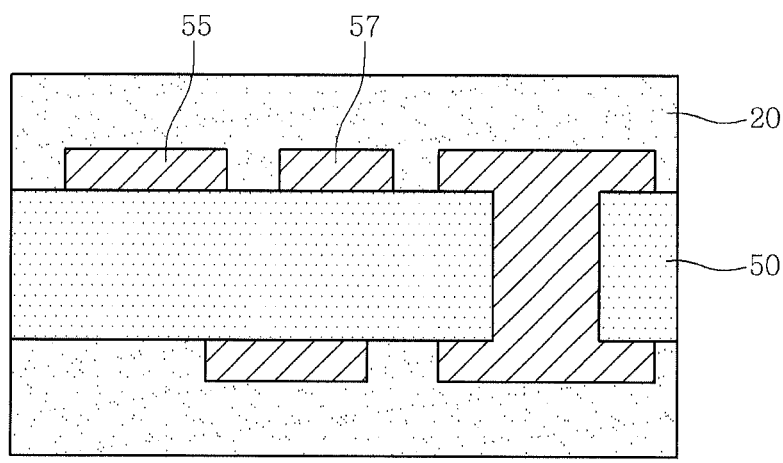

As shown in FIG. 4A, a double-sided substrate, comprising an insulating resin layer 50 and a first circuit layer formed on both surfaces thereof and having a lower land 55 of a via 10 and a circuit pattern 57, is provided.

Figure 4C:
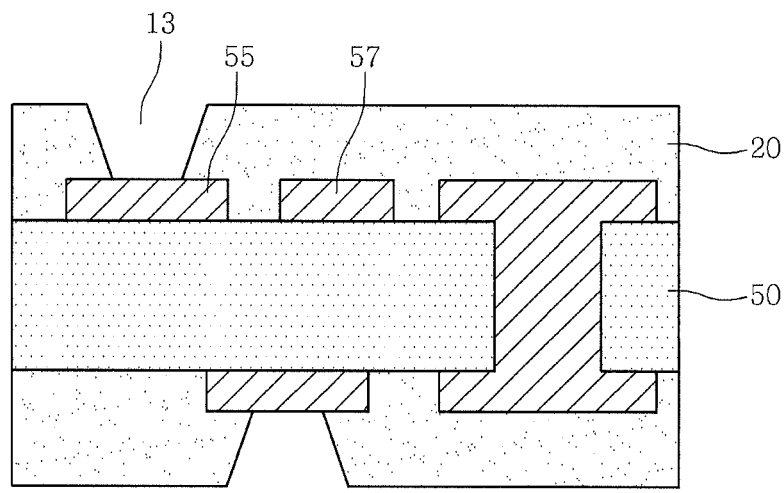
Figure 4D:
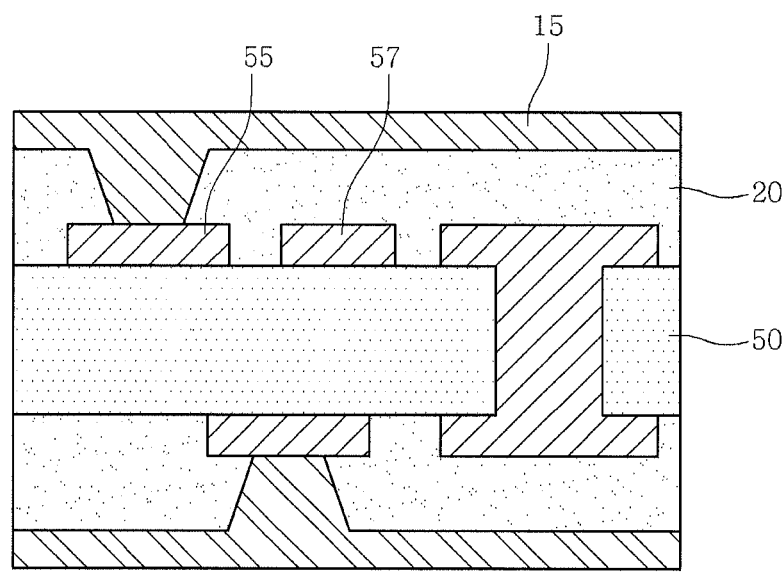
Figure 4E:
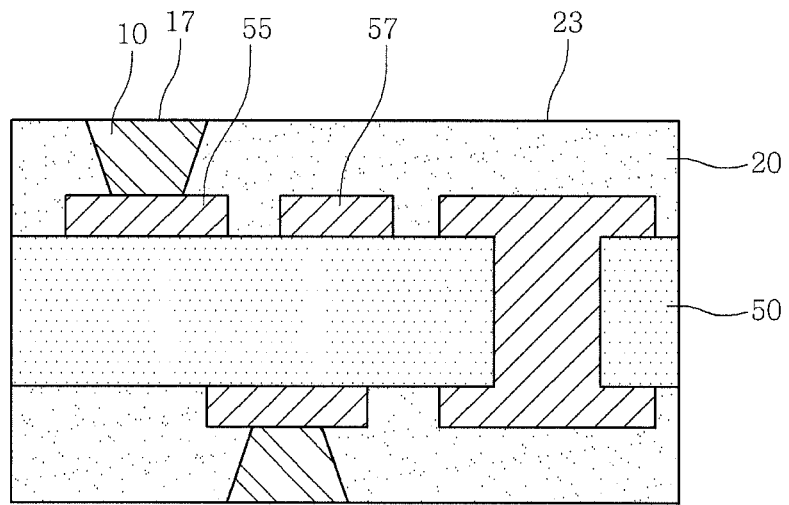
Figure 4F:
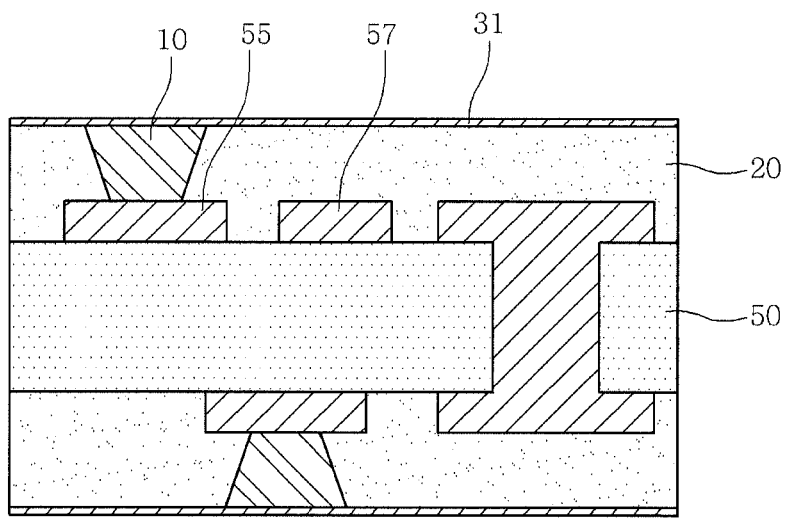
Figure 4G:
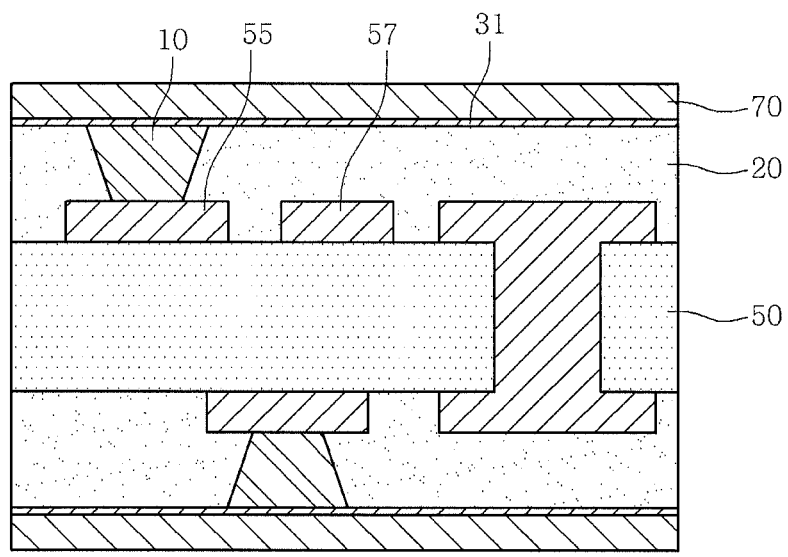
Figure 4H:
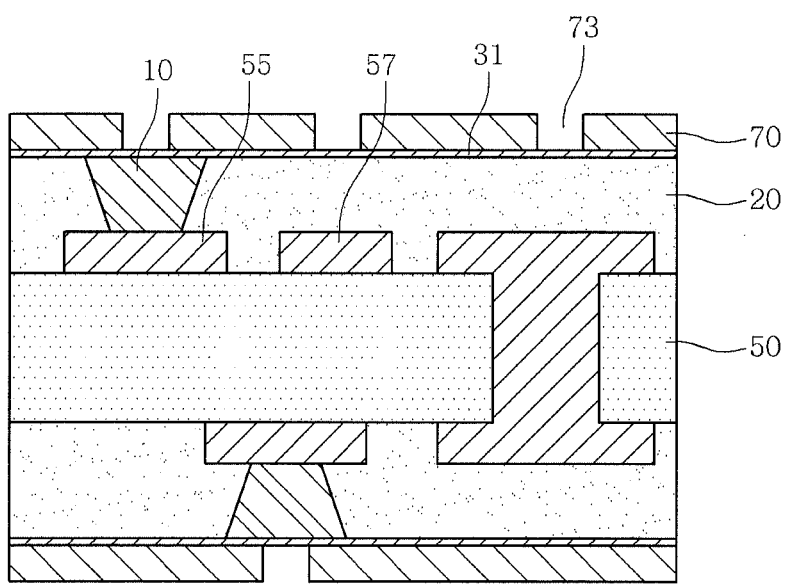
Figure 4I:
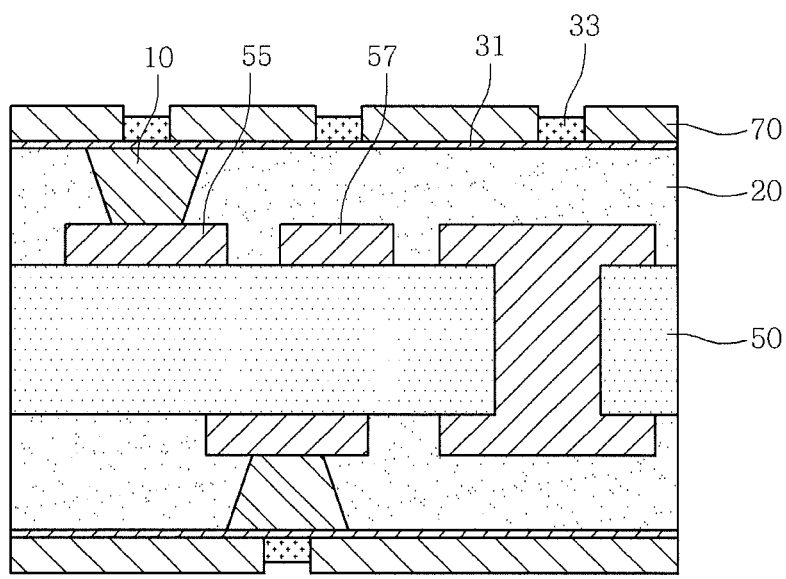

Next, as shown in FIG. 4I, an insulating layer 20 is formed on the circuit layer, and, as shown in FIG. 4C, a via hole 13 is formed in the insulating layer 20 so that the lower land 55 is exposed. To this end, the insulating layer 20 provided on the lower land 55, where the via hole 13 is to be formed, is subjected to laser drilling, particularly, $CO_2$ laser machining, thus forming the via hole 13.

Next, as shown in FIG. 4D, a plating layer 15 of a first metal is formed on the surface of the insulating layer 20, including the inner surface of the via hole 13. In the present invention, copper fill plating is conducted, thus forming the plating layer 15 of the first metal. The via hole 13 is filled with copper through electroless copper plating and copper electroplating.

Next, as shown in FIG. 4E, while the etching amount is adjusted, the portion of the plating layer 15 of the first metal is etched in the thickness direction so that the upper surface of the insulating layer 20 is exposed and the upper surface 23 of the insulating layer 20 is flush with the upper surface 17 of the plating layer loaded in the via hole 13, thus forming the via 10.

The etching process is conducted by placing a substrate having the plating layer 15 of the first metal on a movable conveyor and then passing the substrate, moved by the conveyor, through a water bath containing an etchant. The etching amount is determined by the etching time, that is, the time during which the substrate is immersed in the etchant, and may be adjusted by controlling the passage and speed of the conveyor. In this way, only the plating layer 15 of the first metal, formed on the insulating layer 20, is removed through etching, such that the upper surface 23 of the insulating layer 20 is flush with the upper surface 17 of the plating layer loaded in the via hole 13. In the case where the portion of the plating layer 15 of the first metal is removed through etching using the method of the present invention, the upper surface 17 of the plating layer, loaded in the via hole 13, may be positioned to be slightly lower than the upper surface 23 of the insulating layer 20. However, this does not obstruct the embodiment of the present invention, and is described later with reference to FIGS. 5A and 5B.

Next, as shown in FIG. 4F, a seed layer 31 of a second metal is formed through electroless plating on the upper surface 23 of the insulating layer 20 and the exposed surface 17 of the via 10. As mentioned above, the second metal is a metal having resistance to chemical etching different from those of the first metal and the third metal. The electroless plating is a pretreatment process for forming a conductive film, which is necessary for copper electroplating. In the present invention, electroless plating using nickel is conducted, thereby forming the seed layer 31. In the case where the nickel layer is formed through electrochemical deposition, it is known to exhibit deposition stability superior to other metals and to facilitate the formation of a uniform film having fewer deposition defects.

Next, as shown in FIG. 4G, a resist film 70 is applied on the seed layer 31. In the present invention, a photosensitive resist film is used.

Next, as shown in FIG. 4H, a resist pattern is formed. To this end, the resist film 70 applied on the seed layer 31 is subjected to exposure and development, thus forming an opening 73 in a circuit region corresponding to a second circuit layer including a circuit pattern 30 which is connected to the via 10. The width of the opening 73 of the resist film 70 formed on the via 10 is smaller than the diameter of the via 10.

Next, as shown in FIG. 4I, the opening 73 is plated with a third metal, thus forming a plating layer 33 of the third metal having a line width smaller than the diameter of the via 10 on the via 10. In the present invention, the third metal is copper. Although the first metal and the third metal are shown as being distinguished from each other, it should be noted that the first metal and the third metal are different from the second metal and that the first metal does not need to be different from the third metal.

Figure 4J:
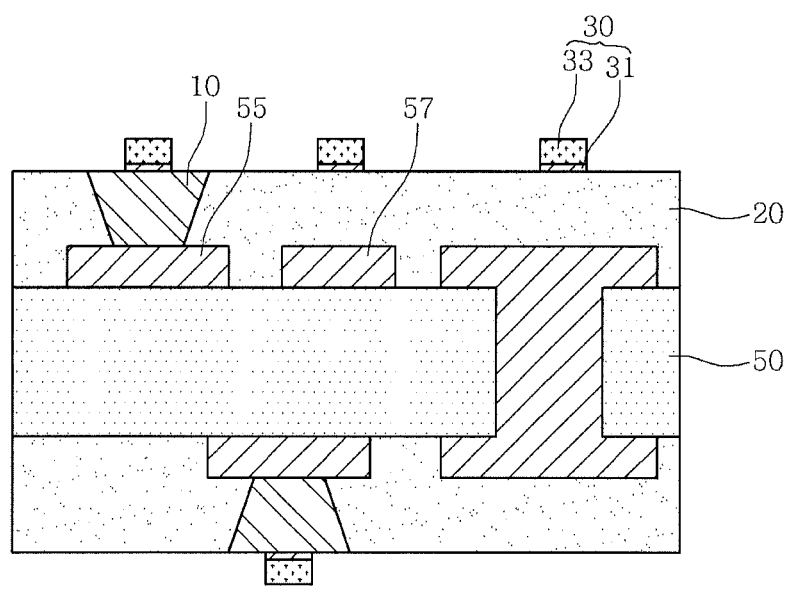

Next, as shown in FIG. 4J, the residual resist film 70 is removed, and the exposed portion of the seed layer 31 is then removed through selective etching, thus completing the second circuit layer 30.

The seed layer 31, made of nickel is selectively etched with the plating layer 33 of the third metal and the via 10, made of copper. Various methods for selectively etching only a specific metal among different metals are known, and in the present invention, a nickel-selective etchant is used to selectively etch nickel with copper.

The nickel-selective etchant indicates a solution that dissolves only nickel or nickel alloy and does not dissolve copper. Using such a solution, without damage to the plating layer 33 of the third metal and the via 10, only the nickel plating layer 31 may be removed. For the nickel-selective etchant, a 550~650 ml/l sulfuric acid solution, an acid mixture solution of sulfuric acid and nitric acid, and a mixture solution of sulfuric acid and m-nitrobenzene sulfonic acid are preferably used.

In this way, the nickel plating layer 31 is selectively removed, thereby completing the PCB having a landless via hole.

Further, the process of selectively etching gold, silver, zinc, palladium, ruthenium, rhodium, a lead-tin solder alloy or a nickel-gold alloy with copper is well-known, and is easily understood by one skilled in the art.

Figure 5A:
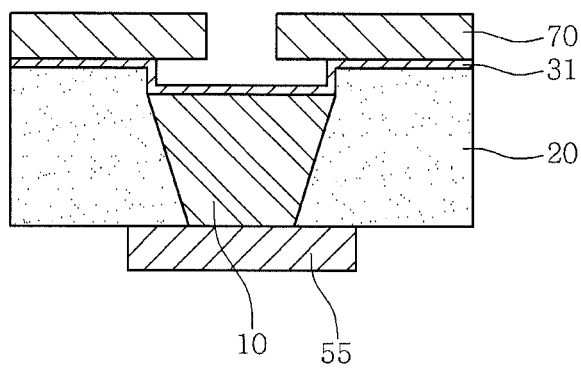
FIGS. 5A and 5B are cross-sectional views illustrating the case in which the upper surface of a via is etched to be lower than the upper surface of an insulating layer.
Figure 5B:
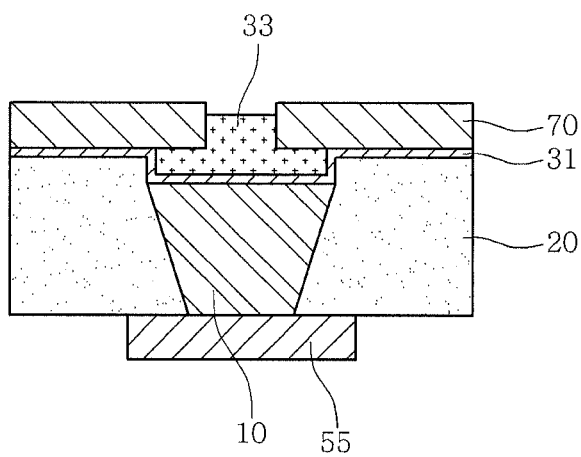

FIGS. 5A and 5B illustrate the case in which the upper surface of the via is etched to be lower than the upper surface of the insulating layer.

Referring to FIG. 5A, in the procedure of FIG. 4D, by which the portion of the plating layer 15 of the first metal is etched to expose the insulating layer 20, the state in which the upper surface 17 of the via 10 is positioned to be lower than the upper surface 23 of the insulating layer 20 due to overetching is illustrated. This phenomenon may be caused in the procedure of removing the plating layer 15 of the first metal formed on the insulating layer 20 using the method of the present invention. In this case, as seen in FIG. 5A, a gap may be present between the resist film 70 and the upper surface 17 of the via 10. This gap is fill-plated with the plating layer 33 of the third metal, thus forming the landless via shown in FIG. 5B. Accordingly, even when the upper surface 17 of the via 10 is etched to be slightly lower than the upper surface 23 of the insulating layer 20, a landless via hole may be realized. The completed landless via 10 is illustrated in FIG. 3C.

Through the aforementioned process according to the present invention, the via 10 is first formed, and the circuit pattern 30 is then formed on the via 10, thus realizing a landless via hole having high reliability between the via 10 and the circuit pattern 30. With reference to FIG. 3B, assuming that the diameter D1 of the via 10 is about 100 μm and that the line width W1 of the circuit pattern 30 is about 30 μm, in the formation of the circuit layer, a matching error range O may be advantageously limited within ±35 μm. Hence, the manufacturing method of the present invention enables the manufacture of the PCB having the landless via hole with higher reliability between the via 10 and the circuit pattern 30, compared to conventional landless methods.

As described hereinbefore, the present invention provides a PCB having a landless via hole and a method of manufacturing the same. In the PCB having a landless via hole according to the present invention, because a via has no upper land, a circuit pattern which is connected to the via can be finely formed, thus realizing a high-density circuit pattern, thereby enabling a reduction in the size of the PCB and the number of layers.

Further, in the method of manufacturing the PCB having a landless via hole according to the present invention, a seed layer is formed with a second metal, which is different from the first metal for the via, and the seed layer is selectively etched, thereby enabling the formation of a circuit pattern which is efficiently connected to the via without damage to the via.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a printed circuit board, comprising:
   providing a substrate including a first circuit layer having a lower land of a via;
   forming an insulating layer on the first circuit layer;
   forming a via hole in the insulating layer so that the lower land is exposed;
   filling the via hole with a first metal, thus forming a via;

forming a seed layer with a second metal on the insulating layer and the exposed surface of the via;

applying a resist film on the seed layer, and then forming a resist pattern having an opening for a second circuit layer, a width of the opening formed on the via being smaller than a width of the via;

plating a circuit region defined by the opening with a third metal, thus forming a plating layer formed of the third metal; and removing the resist film, and then selectively removing an exposed portion of the seed layer, thus forming a second circuit layer.

2. The method as set forth in claim 1, wherein the second metal has resistance to chemical etching different from those of the first metal and the third metal, so that the second metal is etched and the first metal and the third metal are not etched under same chemical etching conditions.

3. The method as set forth in claim 1, wherein the first metal and the third metal are copper, and the second metal is any one selected from among gold, silver, zinc, palladium, ruthenium, nickel, rhodium, lead-tin solder alloys, and nickel-gold alloys.

4. The method as set forth in claim 1, wherein the filling comprises:

plating the first metal on the insulating layer including the via hole, thus forming a plating layer formed of the first metal; and etching a portion of the plating layer formed of the first metal in a thickness direction while adjusting an etching amount, so that an upper surface of the insulating layer is exposed.

5. The method as set forth in claim 4, wherein the adjusting the etching amount in the etching is realized by controlling an etching time.

\* \* \* \* \*

UNITED STATES PATENT AND TRADEMARK OFFICE
CERTIFICATE OF CORRECTION

| | |
|---|---|
| PATENT NO. | : 8,418,361 B2 |
| APPLICATION NO. | : 13/299685 |
| DATED | : April 16, 2013 |
| INVENTOR(S) | : Suk Won Lee et al. |

It is certified that error appears in the above-identified patent and that said Letters Patent is hereby corrected as shown below:

In the Specification

Column 1, Line 14, Delete "Apr. 5, 2008," and insert -- Apr. 15, 2008, --, therefor.

Signed and Sealed this
Tenth Day of September, 2013

Teresa Stanek Rea
*Acting Director of the United States Patent and Trademark Office*